(12) United States Patent
Okumura et al.

(10) Patent No.: US 6,517,670 B2
(45) Date of Patent: Feb. 11, 2003

(54) ETCHING AND CLEANING APPARATUS

(75) Inventors: Tomohiro Okumura, Kadoma (JP); Hiroshi Imai, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 20 days.

(21) Appl. No.: 09/903,069

(22) Filed: Jul. 11, 2001

(65) Prior Publication Data

US 2002/0007914 A1 Jan. 24, 2002

Related U.S. Application Data

(62) Division of application No. 09/339,621, filed on Jun. 24, 1999, now Pat. No. 6,297,165.

(30) Foreign Application Priority Data

Jun. 26, 1998 (JP) ............................................. 10-180092

(51) Int. Cl.[7] .......................... H05H 1/00; H01L 21/00; H02N 13/00
(52) U.S. Cl. ............................... 156/345.28; 156/345.48
(58) Field of Search ...................... 156/345.28, 345.43, 156/345.44, 345.48; 118/723 E, 723 I, 723 R, 712; 323/281, 275; 134/1.1

(56) References Cited

U.S. PATENT DOCUMENTS

| | | | | |
|---|---|---|---|---|
| 5,737,177 A | * | 4/1998 | Mett et al. | 279/128 |
| 5,868,848 A | * | 2/1999 | Tsukamoto | 118/723 E |
| 5,942,889 A | * | 8/1999 | Loewenhardt et al. | 324/158.1 |
| 6,198,616 B1 | * | 3/2001 | Dahimene et al. | 279/128 |

FOREIGN PATENT DOCUMENTS

JP          63-69987    *  3/1998

* cited by examiner

Primary Examiner—Thi Dang
(74) Attorney, Agent, or Firm—Jordan and Hamburg LLP

(57) ABSTRACT

In a plasma processing apparatus wherein plasma is generated in a vacuum chamber 1 thereby to perform etching to a substrate 8 placed on a substrate electrode 7, a voltage monitoring conductor 11 is provided in the vicinity of the substrate electrode 7, and high-frequency power is supplied to both of the substrate electrode 7 and the voltage monitoring conductor 11. Completion of etching operation is detected by monitoring a self-biasing potential generated in this voltage-monitoring conductor 11.

4 Claims, 7 Drawing Sheets

ETCHING AND CLEANING APPARATUS

REFERENCE TO RELATED APPLICATION

This is a division of application Ser. No. 09/339,621, filed Jun. 24, 1999, now U.S. Pat. No. 6,297,165.

BACKGROUND OF THE INVENTION

1. Technical Field of the Invention

The present invention relates to an etching method using plasma for the manufacture of electronic devices such as semi-conductors or micro-machines, and to a cleaning method for the inner wall of a vacuum chamber constituting a plasma processing apparatus, and further to a plasma processing apparatus and a matching circuit for matching high-frequency impedance of load.

2. Description of Prior Art

One example of a conventional high-frequency induction type plasma processing apparatus is shown in FIG. 7 and FIG. 8. In FIG. 7, a gas feeding apparatus 2 introduces a prescribed gas into a vacuum chamber 1 while the vacuum chamber 1 is evacuated by a pump 3 as an evacuation apparatus so as to maintain a predetermined pressure within the vacuum chamber 1. High-frequency electric current is supplied to a dome-like spiral coil 6 disposed on an induction window 5 from a high-frequency power source 4 thereby to generate plasma in the vacuum chamber 1, with which plasma processing can be performed to a substrate 8 placed on a substrate electrode 7, such as etching, deposition, and surface alteration. At the same time, high-frequency electric power is supplied to the substrate electrode 7 through a matching circuit 9 from a high-frequency power source 10, so as to control ion energy beamed on the substrate 8. The plasma processing apparatus of such type is described in detail in Japanese Laid-open Patent Applications 8-83696 and 9-82692.

FIG. 8 shows a detailed diagram of the substrate electrode 7 and matching circuit 9. The substrate electrode 7 comprises a pedestal 12, an insulating member 13, a first chuck electrode 14, and a second chuck electrode 15. The pedestal 12 is connected to a high-frequency output terminal 16 of the matching circuit 9. The substrate 8 is held on the substrate electrode 7 by electrostatic chuck by applying high voltage DC voltage (hundreds to thousands V) of different polarities to the first and second chuck electrodes 14, 15 from a DC power source 17. The matching circuit 9 comprises two variable capacitors 18, 19, a coil 20, a high-frequency input terminal 21, and the high-frequency output terminal 16. The high-frequency input terminal 21 is connected to the high-frequency power source 10. Electrostatic chuck helps enhance the heat-conductivity between the substrate 8 and substrate electrode 7, thereby preventing an excessive raise in temperature of the substrate 8 caused by plasma. Temperature control of the substrate 8 can be more accurately conducted by reserving hundreds Pa of helium gas between the chucked substrate 8 and the substrate electrode 7, thereby further increasing the heat conductive effects.

FIG. 9 shows a mechanical clamp type apparatus, in which the substrate 8 is held on the substrate electrode 7 without using electrostatic chuck. As shown in FIG. 9, the substrate 8 is pressed down on the substrate electrode 7 with a clamp ring 29 by means of a tension force of a spring 28. The surface of substrate electrode 7 is normally covered with an insulating material. Similarly to the electrostatic chuck type apparatus, it is possible to conduct temperature control of the substrate 8 by enhancing the heat conductive effects between the substrate 8 and substrate electrode 7, by reserving helium gas therebetween.

The prior art methods shown in FIG. 7 through FIG. 9 had a problem that the self-biasing potential generated in the substrate cannot be monitored. Specific explanation of this problem is given below.

When high-frequency electric power is supplied to a solid material in contact with plasma, negative DC potentials are generated in the solid material due to the matching effects which are caused by differences in transferring amount of electrons and ions. This DC potential is called self-biasing potential. The self-biasing potential reflects the voltage-current characteristics of plasma and thus reacts sensitively to the change in composition and density of particles in plasma. During the etching process, a substance generated by etching reaction is present in a gaseous state within the vacuum chamber. Once the etching reaction has been completed and the ground surface is exposed, the density of the substance generated by the etching reaction decreases, and the voltage-current characteristics of plasma changes, which affects and causes the self-biasing potential to change even though the amount of high-frequency electric power supplied to the substrate electrode 7 is unchanged. It is thus possible to detect a final point of etching by monitoring the self-biasing potential. Monitoring of self-biasing potential is also effective as a measure to detect a final point of cleaning in the case where plasma is used to clean the inner wall of vacuum chamber 1 contaminated as a result of etching or CVD processing. It is a normal practice to perform such cleaning using a dummy substrate placed on the substrate electrode, in order to prevent wear of the substrate electrode 7.

Despite these benefits of obtaining useful information by monitoring the self-biasing potential, it is not possible in the conventional apparatuses shown in FIG. 7 through FIG. 9 to monitor the self-biasing potential generated in the substrate. In the electrostatic chuck type apparatus, the DC potential of the substrate 8 cannot possibly be measured since the substrate 8 is placed on the insulating member 13 constituting the substrate electrode 7. In the mechanical clamp type apparatus, too, the surface of the substrate electrode 7 is covered with an insulating material and thus the DC potential of the substrate 8 is not measurable. It would be possible to measure the DC potential of the substrate 8 if the insulating material on the surface of the substrate electrode 7 were removed thus allowing conduction between the substrate 8 and the electrode 7, but such construction would be problematic for the following reason. The substrate 8 and the substrate electrode 7 are in contact with each other in an extremely small area since the surfaces thereof are not completely even, and if an electric current is concentrated on the contact areas, it will destroy the device on the substrate such as a transistor or the like (so-called charge-up damage).

Japanese Laid-open Patent Application 3-74843 discloses a method of monitoring the self-biasing potential by directly contacting a metal terminal to the backside of the substrate 8, but with this method even, the charge-up damage cannot be fully prevented.

SUMMARY OF THE INVENTION

In view of the foregoing, an object of the present invention is to provide an etching method in which the end of etching process can be detected without the occurrence of charge-up damage, a cleaning method with which the end of cleaning process can be detected, implemented in a plasma processing apparatus having a matching circuit appropriate for the above purposes.

The present invention provides an etching method wherein an etching operation is performed to a substrate placed on a substrate electrode in a vacuum chamber in which plasma is generated while control is exercised such as to adjust the interior of the vacuum chamber at a prescribed pressure by supplying a gas into the vacuum chamber and evacuating the vacuum chamber, characterized in that high-frequency power is supplied to a voltage monitoring conductor provided on or in the vicinity of the substrate electrode through a matching circuit, and a self-biasing potential generated in the voltage monitoring conductor is monitored during the etching operation.

With the above etching method, completion of the etching operation can be detected based on changes in the self-biasing potential generated in the voltage monitoring conductor.

Preferably, the substrate electrode and the voltage monitoring conductor should be coupled through a capacitor.

In the above method, the substrate may be held on the substrate electrode by means of either a electrostatic chuck system or a mechanical clamp.

The present invention also provides a cleaning method wherein a cleaning operation is performed to inner walls of a vacuum chamber in which plasma is generated while control is exercised such as to adjust the interior of the vacuum chamber at a prescribed pressure by supplying a gas into the vacuum chamber and evacuating the vacuum chamber, characterized in that high-frequency power is supplied to a voltage monitoring conductor provided on or in the vicinity of the substrate electrode through a matching circuit, and a self-biasing potential generated in the voltage monitoring conductor is monitored during the etching operation.

With the above method, completion of the cleaning operation can be detected based on changes in the self-biasing potential generated in the voltage monitoring conductor.

It is preferable that the substrate electrode and the voltage monitoring conductor are coupled through a capacitor.

Also, it is preferable that the cleaning operation is performed under a condition that a dummy substrate is placed on the substrate electrode.

In the above cleaning method, the dummy substrate may be held on the substrate electrode by means of a electrostatic chuck system, or of a mechanical clamp.

The plasma processing apparatus according to the present invention comprises: a vacuum chamber; a gas supply equipment for feeding a gas into the vacuum chamber; an evacuation equipment for evacuating the vacuum chamber; a source of plasma for generating plasma in the vacuum chamber; a matching circuit; a substrate electrode on which a substrate is placed; a high-frequency power source for supplying high-frequency power to the substrate electrode through the matching circuit; a voltage monitoring conductor provided in the vicinity of the substrate electrode, said voltage monitoring conductor being coupled to the substrate electrode such as to allow high-frequency power supply; and a monitoring circuit for monitoring a direct current potential of the voltage monitoring conductor.

It is preferable that the substrate electrode and the voltage monitoring conductor are coupled through a capacitor.

The substrate may be held on the substrate electrode by means of a electrostatic chuck system, or of a mechanical clamp.

The matching circuit in the plasma processing apparatus according to the present invention comprises: a first high-frequency output terminal for providing high-frequency power; a second high-frequency output terminal; a capacitor for coupling said first and second high-frequency output terminals; a monitoring circuit for monitoring a direct current potential of the second high-frequency output terminal; and a direct current potential monitoring output connected to a control system of the plasma processing apparatus.

While novel features of the invention are set forth in the preceding, the invention, both as to organization and content, can be further understood and appreciated, along with other objects and features thereof, from the following detailed description and examples when taken in conjunction with the attached drawings.

DESCRIPTION OF PREFERRED EMBODIMENTS

A first embodiment of the present invention will be described with reference to FIG. 1 through FIG. 3.

Figure 1:
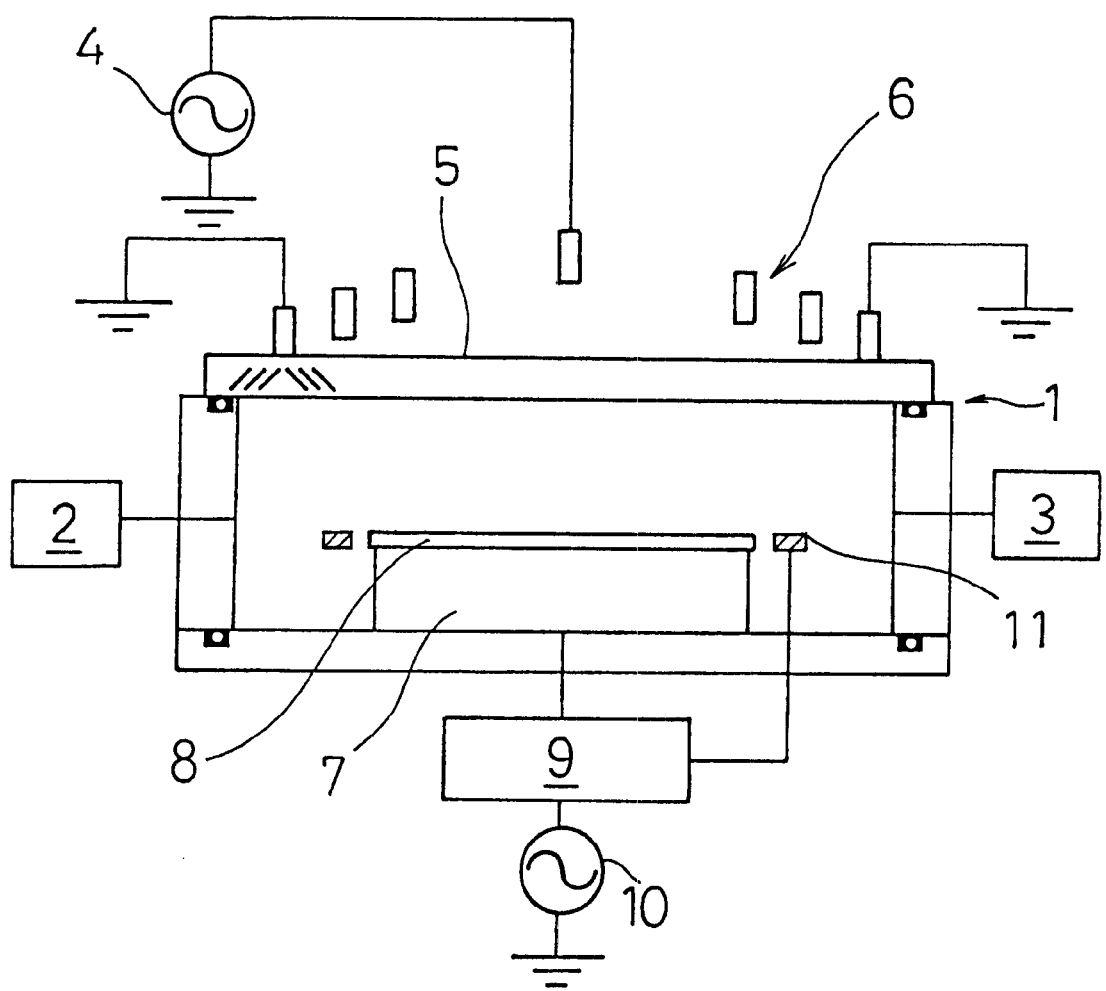
FIG. 1 is a cross sectional view showing the construction of a plasma processing apparatus according to a first embodiment of the present invention.

FIG. 1 shows a cross sectional view of the plasma processing apparatus according to one embodiment of the present invention. In FIG. 1, a gas feeding apparatus 2 introduces a prescribed gas into a vacuum chamber 1 while the vacuum chamber 1 is evacuated by a pump 3 as an evacuation apparatus so as to maintain a predetermined pressure within the vacuum chamber 1. High-frequency electric power is supplied to a dome-like spiral coil 6 disposed on an induction window 5 from a high-frequency power source 4 thereby to generate plasma in the vacuum chamber 1, with which plasma processing can be performed to a substrate 8 placed on a substrate electrode 7, such as etching, deposition, and surface alteration. At the same time, high-frequency electric power is supplied to the substrate electrode 7 through a matching circuit 9 from a high-frequency power source 10, so as to control ion energy beamed on the substrate 8. A ring-form voltage monitoring conductor 11 is provided on the periphery of the substrate electrode 7.

Figure 2:
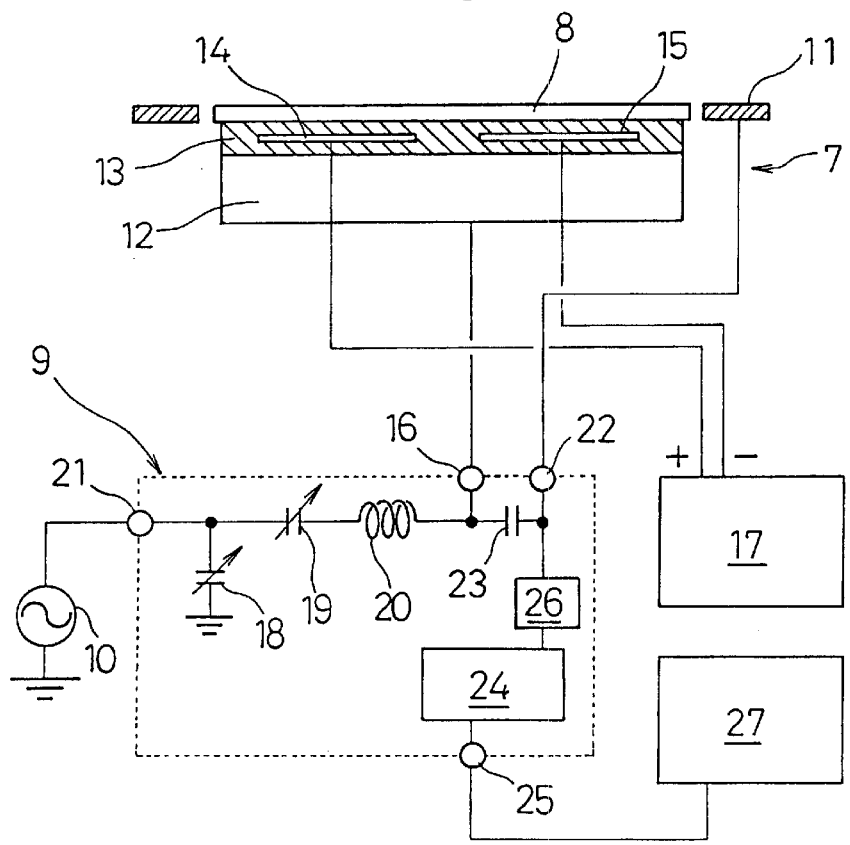
FIG. 2 is a detailed diagram of the substrate electrode and matching circuit in the first embodiment of the present invention.

FIG. 2 shows a detailed diagram of the substrate electrode 7 and matching circuit 9. The substrate electrode 7 comprises a pedestal 12, an insulating member 13, a first chuck electrode 14, and a second chuck electrode 15. The pedestal 12 is connected to a high-frequency output terminal 16 of the matching circuit 9. The substrate 8 is held on the substrate electrode 7 by electrostatic chuck by applying high voltage DC voltage (hundreds to thousands V) of different polarities to the first and second chuck electrodes 14, 15 from a DC power source 17. The matching circuit 9 comprises two variable capacitors 18, 19, a coil 20, a high-frequency input terminal 21, the high-frequency output terminal 16, a second high-frequency output terminal 22, a coupling capacitor 23, a monitoring circuit 24, and a DC potential monitoring output terminal 25. The high-frequency input terminal 21 is connected to the high-frequency power source 10. High-frequency power is supplied to the voltage monitoring conductor 11 through the coupling capacitor 23 and the second high-frequency output terminal 22. Since the potential of the second high-frequency output terminal 22 and the voltage monitoring conductor 11 are the same, by dividing and rectifying the voltage output from the second high-frequency output terminal 22 by means of the monitoring circuit 24, the DC potential monitoring output terminal 25 outputs a voltage that is proportional to a DC potential (self-biasing potential) of the voltage monitoring capacitor 11. The coupling capacitor 23 functions to break a direct current across the voltage monitoring conductor 11 and the pedestal 12. That is, in case the coupling capacitor 23 is not provided, a large negative DC voltage will be generated in the pedestal 12, which induces deterioration of the insulating member 13. A low-pass filter 26 is provided across the second high-frequency output terminal 22 and the monitoring circuit 24, for preventing entrance of high-frequency power. Further, the DC potential monitoring output terminal 25 is connected to a control system 27 of the plasma processing apparatus.

The poly-crystal silicon layer on the substrate 8 was etched by introducing chlorine gas into the gas chamber 1 from the gas supply apparatus 2 while respectively applying high-frequency power of 500 W to the spiral coil 6 and of 50 W in total to the substrate electrode 7 and the voltage monitoring conductor 11. The change in self-biasing potential of the voltage monitoring conductor 11 is shown in FIG. 3.

Figure 3:
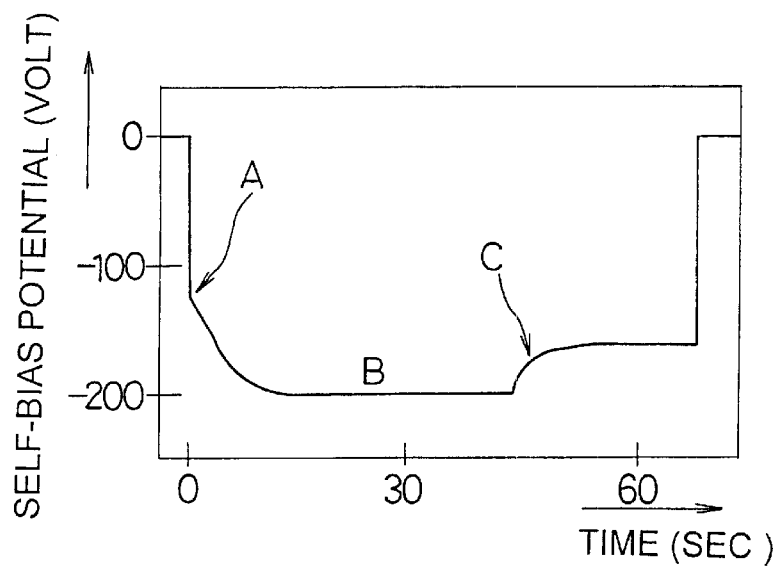
FIG. 3 is a diagram showing the change in self-biasing potential of a voltage monitoring conductor in the first embodiment of the present invention.

High-frequency power supply was started at A in FIG. 3, and after a transient state for several seconds, the poly-crystal silicon layer was etched (B). The potential raises drastically at C, which shows the point when etching of the poly-crystal silicon layer was finished, upon which there was a change in composition and density of particles in plasma. That is, the great negative value of self-biasing potential during etching reflects low electronic density of plasma due to the presence of etching products in plasma mainly composed of silicon tetrachloride. When etching is finished, the silicon tetrachloride in plasma disappears and the electronic density of plasma increases, in response to which the self-biasing potential increases to a smaller negative value. The end point of etching can thus be detected by monitoring the self-biasing potential.

Transistors on the substrate 8 produced by performing etching as described above were evaluated. No device destruction caused by charge-up damage was detected. It is assumed that this was because electric current was not concentrated to particular areas of contact surface between the substrate 8 and substrate electrode 7, since, unlike the prior art apparatus, the substrate 8 and substrate electrode 7 are insulated in this embodiment.

Next, another embodiment of the present invention is described. The apparatus of this embodiment is substantially similar to that of the first embodiment, and the description thereof will be omitted.

The substrate 8 was placed on the substrate electrode 7, and silane gas, oxygen gas, and argon gas were introduced into the vacuum chamber 1 from the gas supply apparatus 2 while respectively applying high-frequency power of 1000 W to the spiral coil 6 and of 500 W in total to the substrate electrode 7 and the voltage monitoring conductor 11, thereby depositing a thin film of silicon dioxide on the substrate 8. After repeating the above operation several times, a film of silicon dioxide was thickly deposited on the inner wall of the vacuum chamber 1 as well. Thus, for the purpose of cleaning the inner wall of the vacuum chamber 1, a dummy substrate 8 was placed on the substrate electrode 7, and tetrafluorocarbon gas and oxygen gas were introduced into the vacuum chamber 1 from the gas supply apparatus 2 while respectively applying high-frequency power of 1000 W to the spiral coil 6 and of 100 W in total to the substrate electrode 7 and the voltage monitoring conductor 11. The change in self-biasing potential of the voltage monitoring conductor 11 is shown in FIG. 4.

Figure 4:
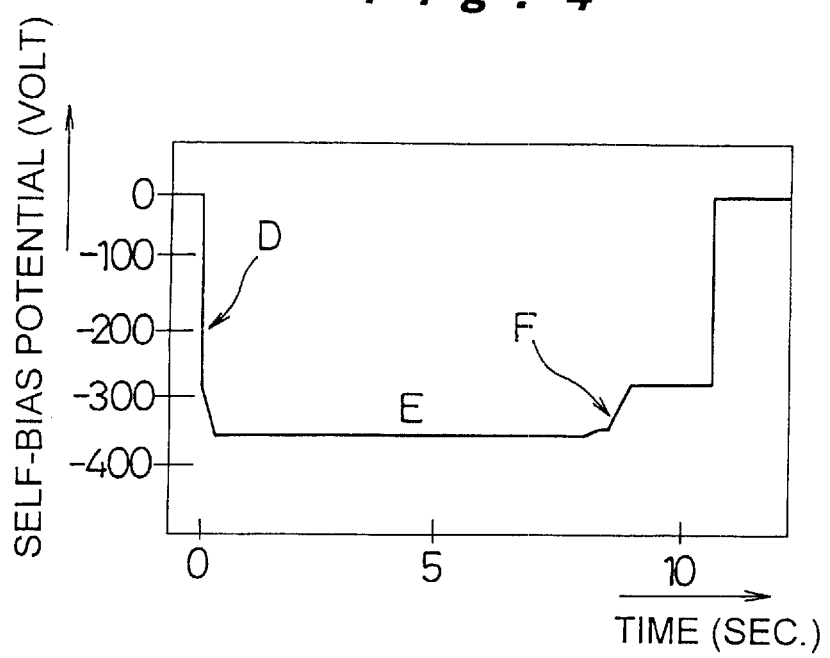
FIG. 4 is a diagram showing the change in self-biasing potential of a voltage monitoring conductor in a second embodiment of the present invention.

High-frequency power supply was started at D in FIG. 4, and after a transient state for several seconds, the silicon dioxide film deposited on the inner wall of the vacuum chamber was removed (E). The potential raises drastically at F, which shows the point when cleaning of the silicon dioxide film was finished, upon which there was a change in composition and density of particles in plasma. That is, the great negative value of self-biasing potential during cleaning reflects low electronic density of plasma due to the presence of etching products in plasma mainly composed of silicon tetrachloride and carbon dioxide. When cleaning is finished, the silicon tetrachloride and carbon dioxide in plasma disappear and the electronic density of plasma increases, in response to which the self-biasing potential increases to a smaller negative value. The end point of cleaning can thus be detected by monitoring the self-biasing potential.

Although the plasma processing apparatus of high-frequency induction type has been described as one embodiment of the present invention, the present invention is not limited to this type and may be applied to other types of plasma processing apparatuses, such as parallel flat panel type, magnetic field micro-wave type, helicon wave type, and surface wave type.

Also, the configuration of the voltage monitoring conductor is not limited to the ring-form as described in the above embodiments but may be variously designed.

Figure 5:
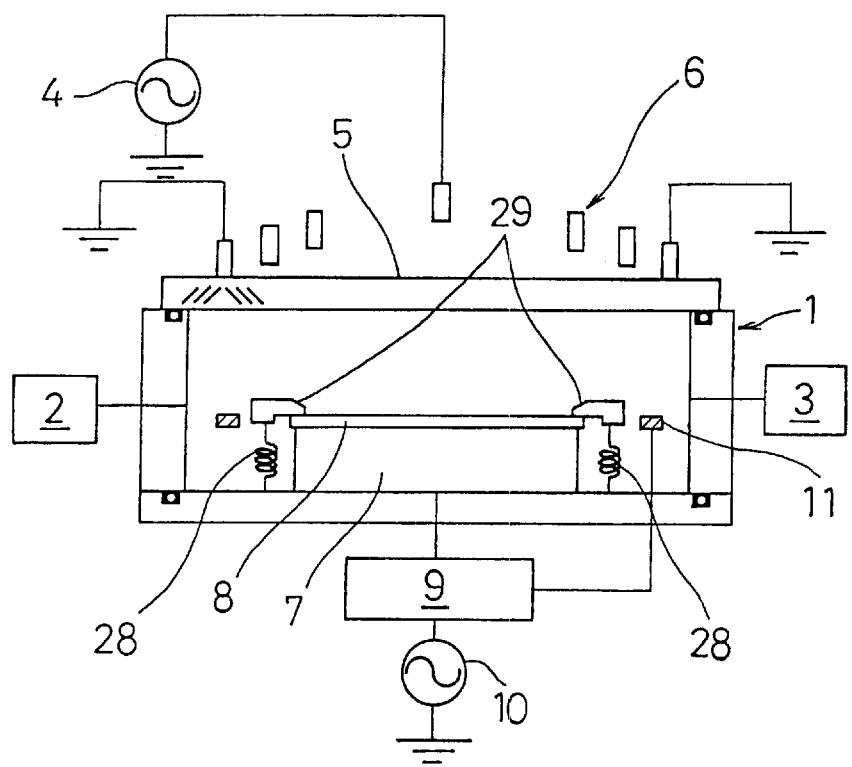
FIG. 5 is a cross sectional view showing the construction of a plasma processing apparatus according to another embodiment of the present invention.
Figure 6:
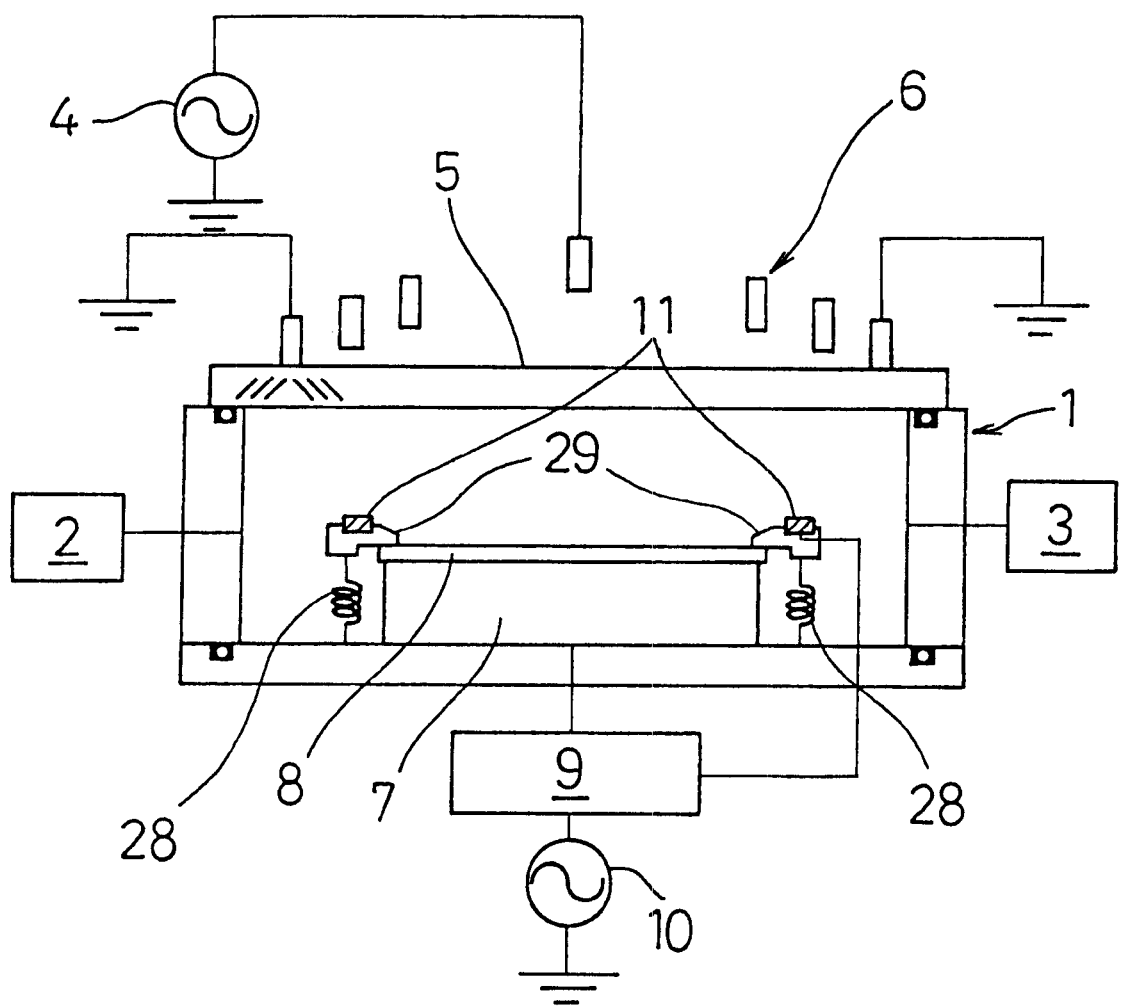
FIG. 6 is a cross sectional view showing the construction of a plasma processing apparatus according to a yet another embodiment of the present invention.
Figure 7:
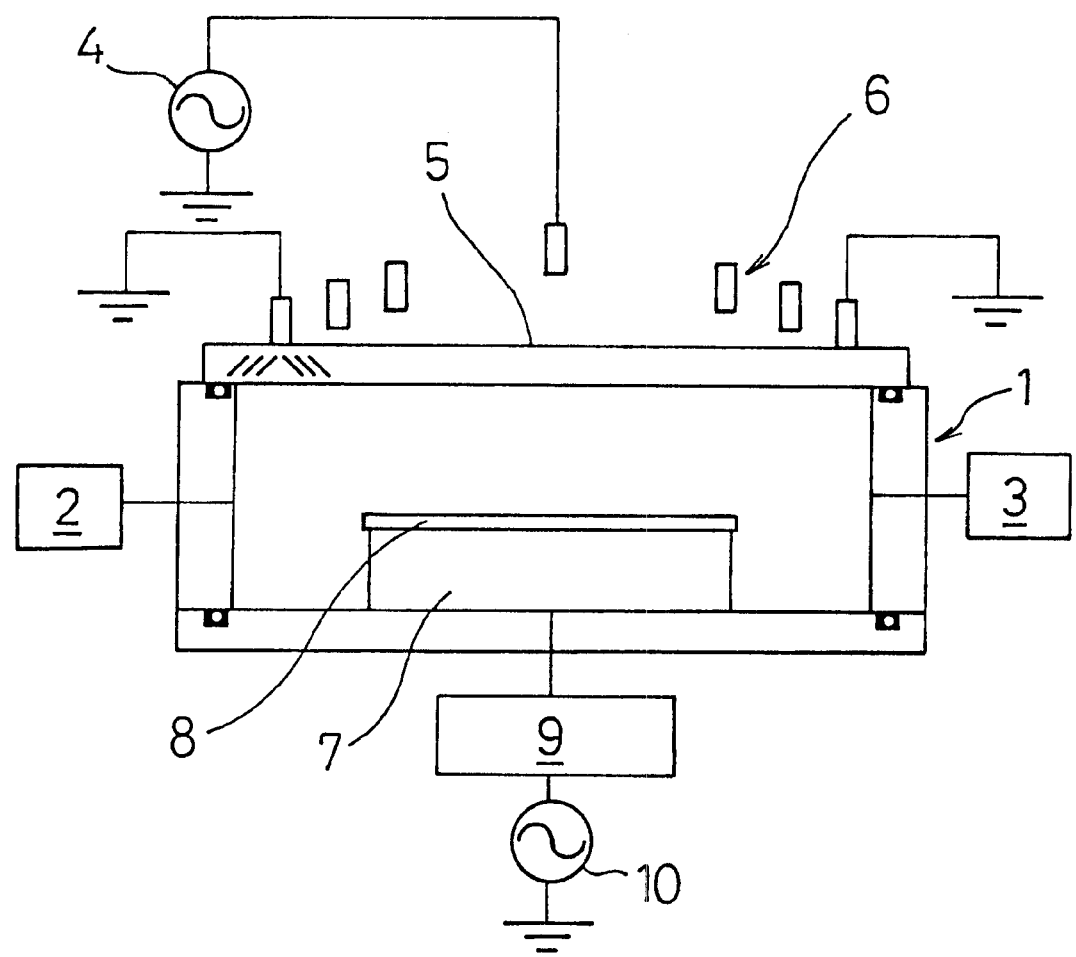
FIG. 7 is a cross sectional view showing the construction of a conventional plasma processing apparatus.
Figure 8:
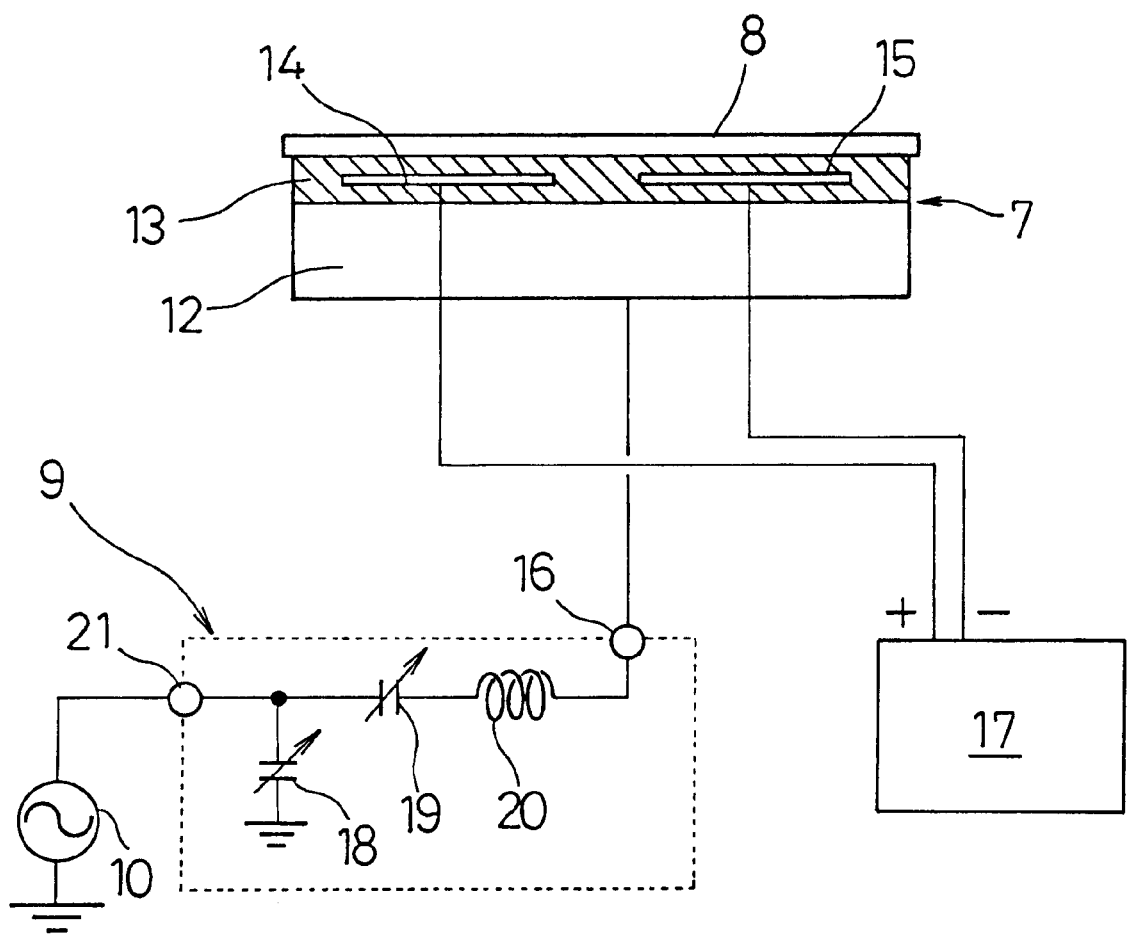
FIG. 8 is a detailed diagram of the substrate electrode and matching circuit in the prior art.
Figure 9:
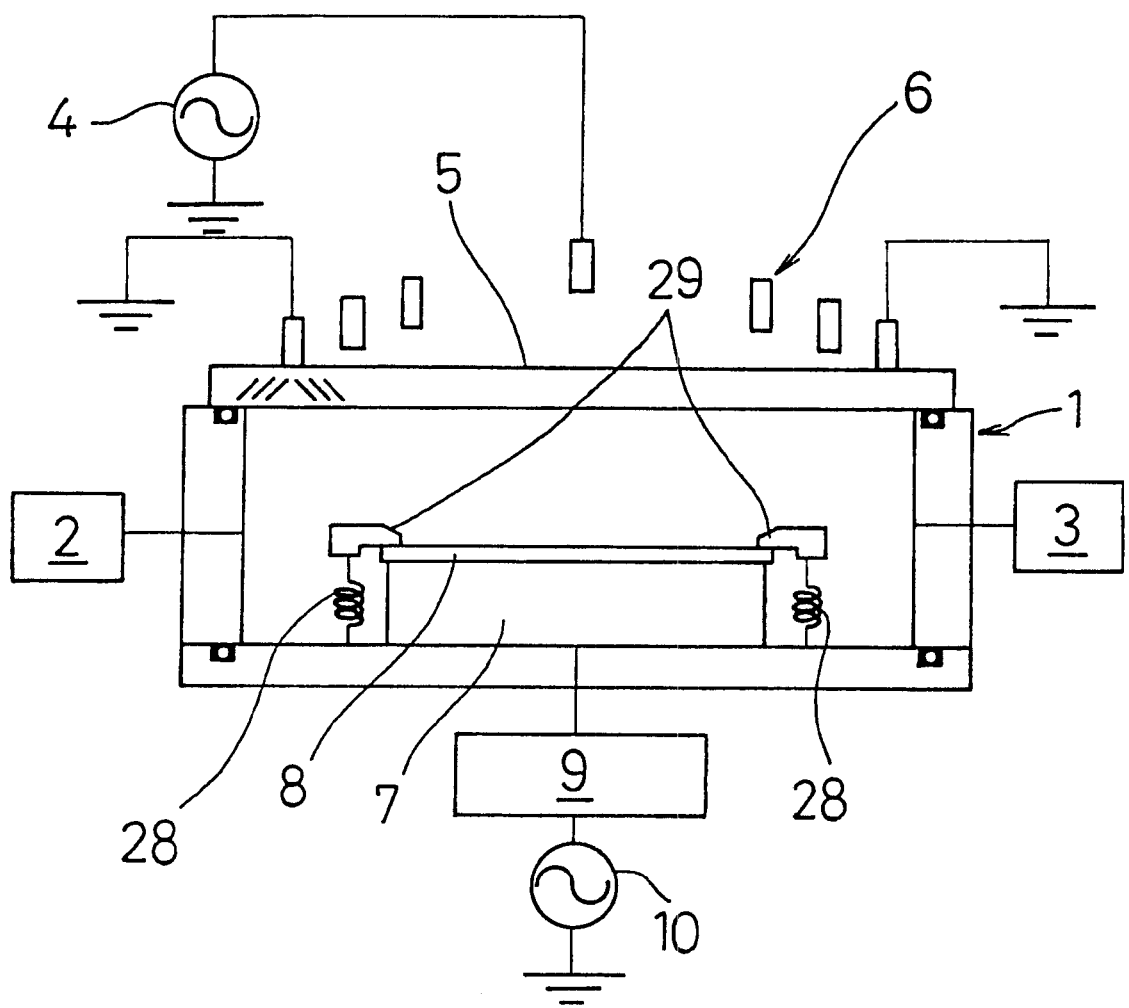
FIG. 9 is a cross sectional view showing the construction of another conventional plasma processing apparatus.

Also, not only in the electrostatic chuck system but also in a case where mechanical clamps as shown in FIG. 9 are used for holding the substrate on the substrate electrode is the present invention applicable. In such a case, the voltage monitoring conductor 11 may be provided around the clamp ring 29 for pressing down the substrate 8 onto the substrate electrode 7 by means of the spring 28, or may be arranged on the clamp ring 29 as shown in FIG. 6. There are of course many other variations other than the examples shown in FIG. 5 or FIG. 6.

Although the present invention has been fully described in connection with the preferred embodiment thereof, it is to be noted that various changes and modifications apparent to those skilled in the art are to be understood as included within the scope of the present invention as defined by the appended claims unless they depart therefrom.

What is claimed is:

1. A plasma processing apparatus comprising:
   a vacuum chamber;

a gas supply equipment for feeding gas into the vacuum chamber;

an evacuation equipment for evacuating the vacuum chamber;

a source of plasma for generating plasma in the vacuum chamber;

a matching circuit;

a substrate electrode on which a substrate is placed;

a high-frequency power source for supplying high-frequency power to the substrate electrode through the matching circuit;

a voltage monitoring conductor provided in the vicinity of the substrate electrode, said voltage monitoring conductor being coupled to the substrate electrode such as to allow high-frequency power supply;

said voltage monitoring conductor AC coupled to said substrate electrode with a DC isolated connection; and a monitoring circuit for monitoring a direct current potential of the voltage monitoring conductor.

2. The plasma processing apparatus according to claim 1, wherein the substrate electrode and the voltage monitoring conductor are coupled through a capacitor.

3. The plasma processing apparatus according to claim 1, wherein the substrate is held on the substrate electrode by means of a electrostatic chuck system.

4. The plasma processing apparatus according to claim 1, wherein the substrate is held on the substrate electrode by means of a mechanical clamp.

* * * * *